(12) United States Patent
Van Loon et al.

(10) Patent No.: US 8,121,279 B2
(45) Date of Patent: Feb. 21, 2012

(54) DISCUSSION UNIT WITH REMOVABLE RIM

(75) Inventors: Marc Van Loon, Roosendaal (NL); Gerard Boersen, Dongen (NL); Ko Van Bruinessen, Breda (NL); Martien Kas, St. Willebrord (NL); Ruud De Wit, Geertruidenberg (NL); Ad Hermans, Chaam (NL)

(73) Assignee: Robert Bosch GmbH, Stuttgart (DE)

(*) Notice: Subject to any disclaimer, the term of this patent is extended or adjusted under 35 U.S.C. 154(b) by 380 days.

(21) Appl. No.: 10/591,071

(22) PCT Filed: Sep. 9, 2005

(86) PCT No.: PCT/EP2005/054495
§ 371 (c)(1),
(2), (4) Date: Aug. 30, 2006

(87) PCT Pub. No.: WO2007/028422
PCT Pub. Date: Mar. 15, 2007

(65) Prior Publication Data
US 2008/0240390 A1    Oct. 2, 2008

(51) Int. Cl.
*H04M 3/42* (2006.01)
(52) U.S. Cl. ................ 379/204.01; 379/428.01
(58) Field of Classification Search .......... 379/202.01, 379/447, 455, 433; 455/90.3, 575, 351
See application file for complete search history.

(56) References Cited

U.S. PATENT DOCUMENTS

| | | | |
|---|---|---|---|
| 3,955,054 A | 5/1976 | Hemming et al. | |
| 5,139,319 A | 8/1992 | Miyai et al. | |
| 5,768,370 A * | 6/1998 | Maatta et al. | 379/433.01 |
| 6,347,218 B1 * | 2/2002 | Fuhrmann et al. | 455/90.1 |
| 6,463,263 B1 * | 10/2002 | Feilner et al. | 455/90.1 |
| 7,239,700 B2 | 7/2007 | Fuhrmann et al. | |
| 2002/0057792 A1 | 5/2002 | Fuhrmann et al. | |

FOREIGN PATENT DOCUMENTS

| | | |
|---|---|---|
| DE | 29 02 052 | 7/1980 |
| EP | 0 484 793 | 5/1992 |
| JP | 2-32596 | 2/1990 |
| JP | 2000505620 | 5/2000 |
| JP | 2003-78601 | 3/2003 |
| WO | 02/05610 | 1/2002 |

* cited by examiner

*Primary Examiner* — Curtis Kuntz
*Assistant Examiner* — Amal Zenati
(74) *Attorney, Agent, or Firm* — Michael J. Striker

(57) ABSTRACT

The discussion unit (10) for use in a conference system is disclosed, which is adapted to be connected to at least one second discussion unit (10). The discussion unit (10) comprises an essentially closed casing (410) and at least one exchangeable portion (420). The at least one exchangeable portion (420) is removably mounted to the casing (410) and at least partially covers at least one outside part (424, 412) of the casing (410). The invention allows for an easy first installation of the exchangeable portion (420). Nevertheless, after installation, the exchangeable portion (420) is difficult to remove by a user (preventing unintended removal or removal by vandalism or "play instinct"), but allowing for an easy exchange of the exchangeable portion (420) by an installer and/or a service technician.

10 Claims, 5 Drawing Sheets

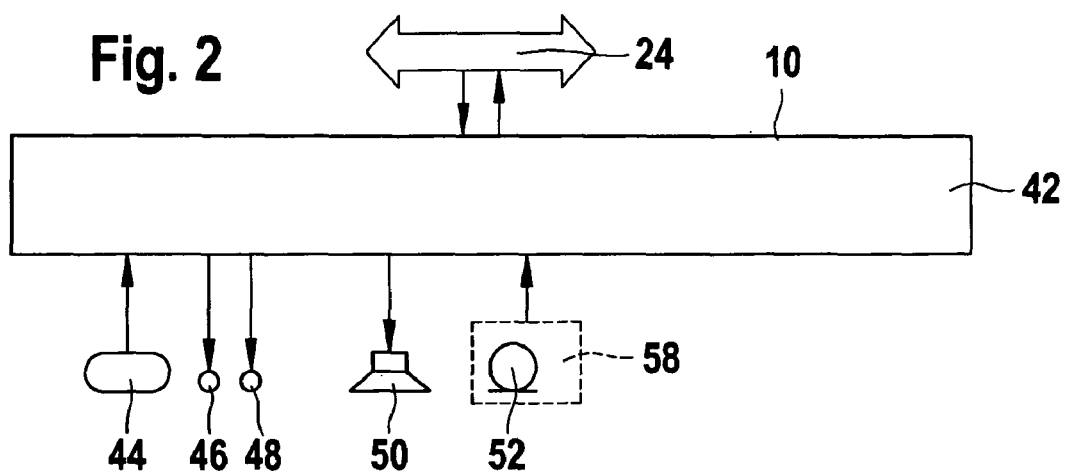
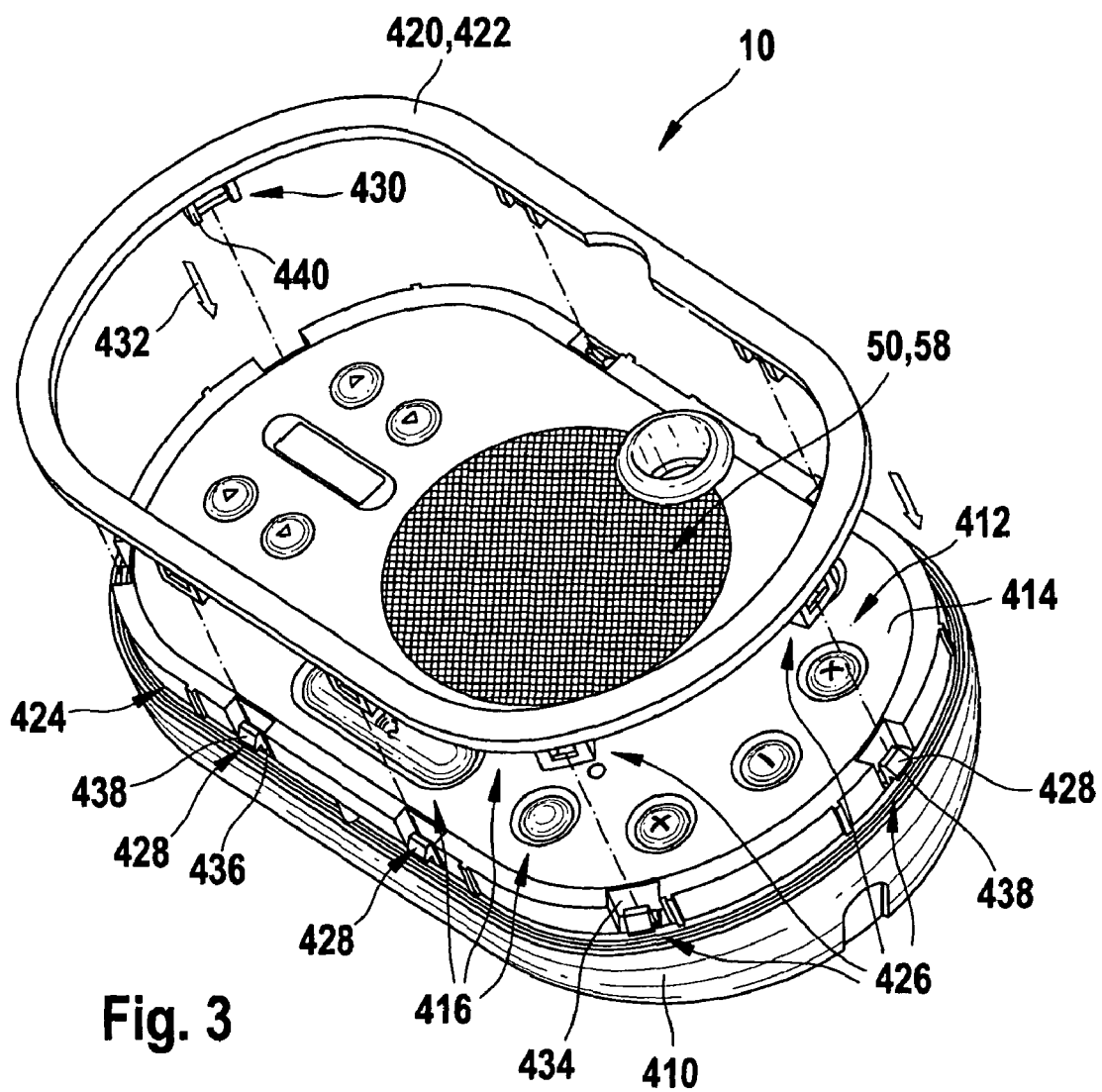

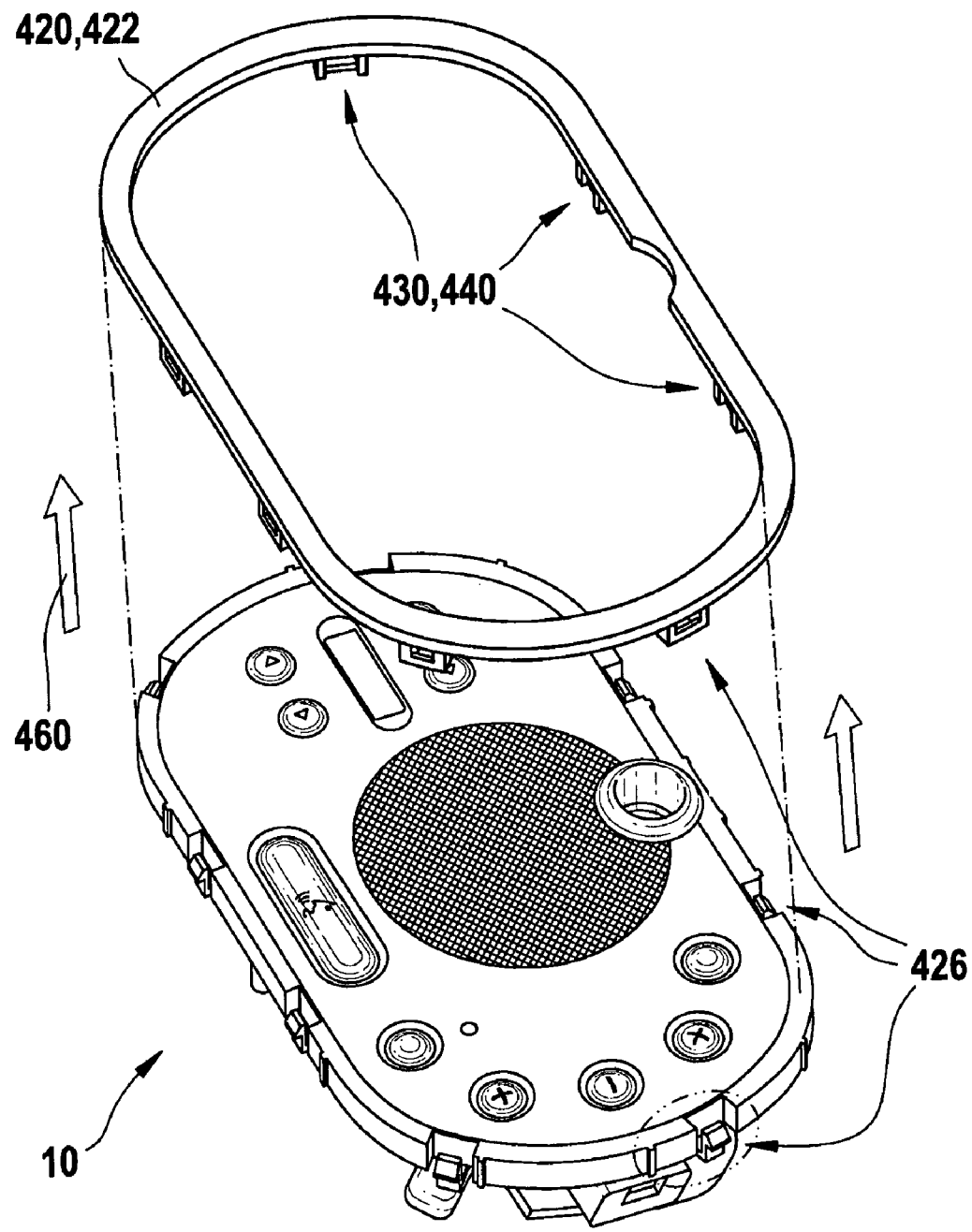
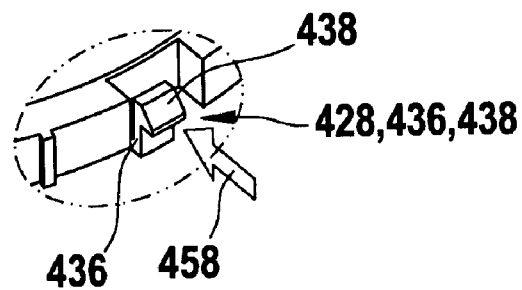
Fig. 4D

DISCUSSION UNIT WITH REMOVABLE RIM

The invention relates to a discussion unit for a conference system, the discussion unit comprising a removable and exchangeable rim for changing the look and/or the haptic impression of the discussion unit. The invention further relates to a set comprising at least one exchangeable portion adapted to be used in a discussion unit according to the invention, as well as to a conference system comprising at least two discussion units.

PRIOR ART

In the following, the expression "discussion unit" is used as a generic expression with respect to a unit to be used by a conference delegate or a unit to be used by a chairman ("chairman unit"). A system comprising at least two discussion units is referred to as a "conference system". Nevertheless, besides the discussion units, the conference system may comprise other components.

Conference Systems are used to facilitate discussions between participants of conferences or meetings. The conference systems typically are installed (permanently or non-permanently) in the conference rooms for private or public use. These conference systems typically are adapted to allow for a speaker to give a speech using a microphone, and for a chairman of the conference to control the speech, such as by switching on or off the speaker's microphone.

EP 0 484 793 A1 discloses a communication system and a central processing unit as well as a communication station in the communication system. The communication system comprises a central processing unit and a plurality of communication stations, in which the central processing unit and the communication stations are coupled over an uplink signal line and a downlink signal line.

Nevertheless, even if conference systems known from prior art allow for an efficient electronical support of the conference and/or discussion, these conference systems typically involve the disadvantage of disturbing the ambiance of the conference room. Since most well-established public conference rooms, as well as private conference rooms of enterprises and firms take pride in an "upscale" ambiance, the integration of sophisticated electronic components, such as the conference systems known from prior art, are typically rather challenging with respect to interior design aspects. Thus, the electronic components of the conference systems have matched with furnishings and decoratings, as well as with the "spirit" the owner of the conference room wants to create. Thus, conference systems usually have to be delivered by the manufacturer with a number of options regarding the design, in order to match the furniture and/or the decoration of the conference rooms.

This again imposes on the manufacturer the pressure to provide the conference systems in a large variety of designs, creating a significant amount of extra cost with regard to manufacturing, stocking and distribution. And still, the chance that a conference system matching the design of each and every conference room is available, is rather small.

ADVANTAGES OF THE INVENTION

A discussion unit, a conference system and an exchangeable portion as well as a set of exchangeable portions are disclosed, which allow for an easy adaption of the conference system to the ambiance the conference system is used in. The discussion unit is adapted to be connected to at least one second discussion unit, thus forming the conference system. This "connection" may be designed in various ways, like a cable system and/or one or more wireless connections. Other ways of connecting are known to the person skilled in the art. Further, the connection might be a "direct" connection from unit to unit, and/or it might comprise an "indirect" connection via a central unit or central system. Thus, a connection using a "loopthrough" topology and/or a "star" topology might be used. Other alternative embodiments are known to the person skilled in the art.

Further, the conference system may comprise at least one chairman unit. This chairman unit may, e.g., comprise a discussion unit for a chairman. Thus, e.g. by modifying/adapting a discussion unit, the same or a similar type of discussion unit may be used by a chairman as well as by a delegate. How the chairman unit is used is determined in the system. As a default, with the chairman unit might provide a first button, which allows the chairman to speak, e.g. even if the maximum number of open microphones is reached. Further, there might be a second button allowing for the chairman to overrule the discussion: all microphones of the delegates might at that moment be switched off and, optionally, a chime might be produced by the conference system. Further potential embodiments of the details of the discussion unit and the conference system are described in detail below.

The discussion unit further comprises an essentially closed casing, and at least one exchangeable portion. This at least one exchangeable portion preferably may comprise at least one rim, preferably a closed rim. The rim may have an essentially round shape, such as a circular and/or an oval shape. The rim may cover at least one edge portion of the discussion unit. Further, the discussion unit preferably comprises at least one operating panel. This operating panel may comprise at least one panel base (such as a base plate etc.) and at least one operating element, such as an operating button and/or an operating dial. The panel base may be at least partially surrounded by the rim.

The at least one exchangeable portion is removably mounted to the casing and covers at least one outside part of the casing. Thus, as disclosed above, the exchangeable portion may cover an edge portion of the discussion unit. In order to overcome the problems disclosed above, which are inherent to the fact that the exchangeable portion has to be easily removable by an installer or a service technician, but should not be too easily removable by a conference participant, the exchangeable portion may preferably be mounted to the casing by at least one interconnection. This at least one interconnection may comprise a form-fit interconnection and/or a force-fit interconnection, preferably a snap-on mounting and/or a snap-hook and/or a catch. Preferably, this at least one interconnection is not accessible to the conference participant when the discussion unit and the conference system are in use. This can be accomplished by the following embodiment: The casing of the discussion unit may comprise at least one first section and at least one second section wherein the at least one first section and the at least one second section are adapted to be attached to each other. This attachment may be performed by using arbitrary attachment means known to the person skilled in the art, but preferably comprises screwing. When the at least one first section and the at least one second section are attached to each other, the at least one interconnection is inaccessible from the outside of the casing, and, thus, is inaccessible to the participant of the conference.

The conference system and the discussion unit according to one of the embodiments described above are well suited to solve the manufacturing and/or distribution problems disclosed above, as well as to suit the need for frequent design changes of the discussion units and/or the conference system.

A first installation of the exchangeable portion, i.e. when no exchangeable portion has been installed, yet, is easy. Nevertheless, after installation, the exchangeable portion is difficult to remove by a user (preventing unintended removal or removal by vandalism or "play instinct"), but allowing for an exchange of the exchangeable portion by an installer and/or a service technician. Thus, a service technician and/or an installer may easily change the looks and the feelings of the discussion units by, e.g., installing or exchanging the removable rim of the discussion unit. Thus, the appearance of the discussion unit may be changed by using one of a set of exchangeable portions, the chosen exchangeable portion being adapted to the ambiance of the conference room.

The discussion unit may even be delivered by a manufacturer or supplier without any exchangeable portions, and the exchangeable portions may be purchased separately, e.g. as a set of exchangeable portions. The set of exchangeable portions may comprise various exchangeable portions, such as rims of various colors and/or materials, such as plastic materials, wood or metal. Thus, e.g., by using a metal rim, even the haptic feelings may be changed, in order for the discussion unit to gain a "cold feeling" when it is touched, which is often associated instinctively with a high quality. The exchangeable portions, such as a set of exchangeable portions, may be sold separately and may be ordered by the owner of the conference room or the supplier of the conference system, in order to match the ambiance of the conference room.

DRAWING

An exemplary embodiment of the invention is shown in the drawing and described in further detail in the ensuing description.

In the drawings:

FIG. 2 shows a block diagram of a preferred embodiment of a discussion unit according to the invention;

FIG. 3 shows a first embodiment of a discussion unit according to the invention having an exchangeable rim; and FIGS. 4A to 4D show the steps of removing an exchangeable rim from a second, preferred embodiment of a discussion unit according to the invention.

DESCRIPTION OF THE EXEMPLARY EMBODIMENTS

Figure 1:
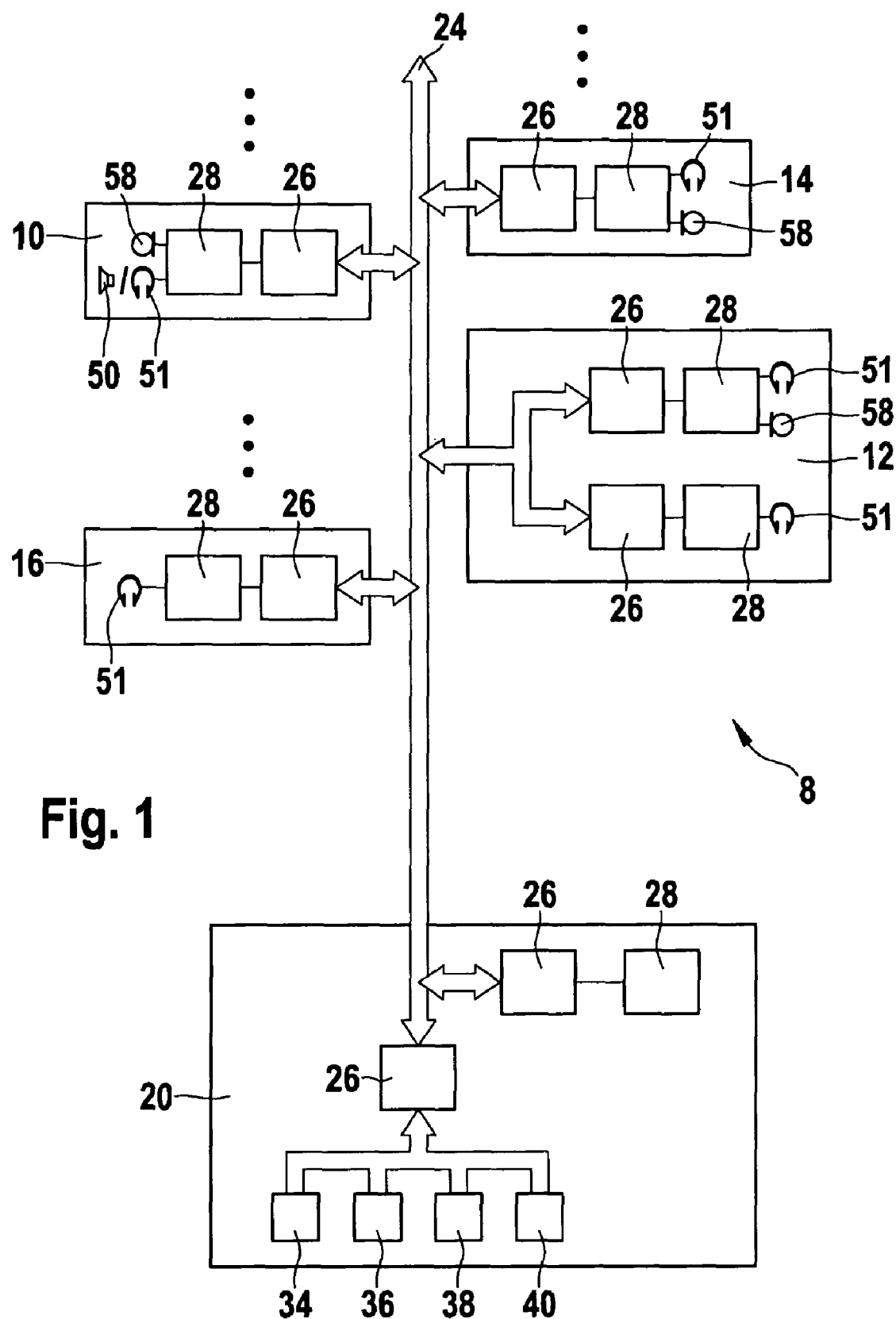
FIG. 1 shows a block diagram of a preferred embodiment of a conference system according to the invention.

FIG. 1 shows a block diagram of a preferred embodiment of a conference system 8 according to the invention. The conference system 8 comprises discussion units 10 for use by one or more delegates (only one of them is shown in FIG. 1) and a chairman unit 12. The conference system 8 further comprises a central control unit 20 and an audio communication network 24. Discussion units 10, the chairman unit 12, interpreter units 14, language distribution units 16 and the central control unit 20 are connected to the audio communication network 24. In the preferred embodiment, the signal transmission and the signal processing is handled by digital audio technology. The discussion unit 10 comprises a network protocol converter 26, an analogue-digital converter 28, a loudspeaker 50, a headphone 51 and a microphone 58. In the preferred embodiment, the discussion unit 10 allows participants of the conference to access facilities to listen, speak, register a request-to-speak and receive simultaneous interpretation of the floor language.

An embodiment of the discussion unit 10 is shown in FIG. 2 (a detailed description will be given below). The chairman unit 12 comprises network protocol converters 26, analogue-digital converters 28, headphones 51 and a microphone 58. In the preferred embodiment, the chairman unit 12 is adapted to control the conference proceeding. Furthermore, the chairman unit 12 has a microphone priority system that temporarily mutes active microphones 58. The interpreter unit 14 comprises a network protocol converter 26, an analogue-digital converter 28, a headphone 51 and a microphone 58 allowing simultaneous interpretation and distribution of the interpretations to conference participants over the audio communication network 24 to the discussion units 10, the chairman unit 12 and the language distribution unit 16. The language distribution unit comprises a network protocol converter 26, an analogue-digital converter 28 and a headphone 51 allowing people present at the conference in a non-contributing role to listen to any of the interpretations through headphones 51. The central control unit 20 comprises network protocol converters, an analogue-digital converter 28, a read-only-memory 34 (ROM), a random-access-memory 36 (RAM), a flash EPROM 38 and a digital signal processor 40 (DSP). In the preferred embodiment, the central protocol unit 20 provides automatic conference control and microphone management. The network protocol converter 26 connects the analogue-digital converter 28 to the audio communication network 24 and furnishes the network protocol, wherein the analogue-digital converter 28 is a combined analogue-to-digital and digital-to-analogue converter converting the digital signal from the audio communication network 24 to audio, and converting the audio signal to digital.

FIG. 2 shows a block diagram of the discussion unit 10, comprising a processing device 42 and a microphone 58. The discussion unit 10 further comprises a request-to-speak-button 44, a microphone-on-indicator 46 on the discussion unit 10, a request-to-speak-indicator 48 on the discussion unit 10 and a loudspeaker 50. In the preferred embodiment, the processing device 42 controls the discussion unit 10 and furnishes a bidirectional signal connection to the audio communication network 24. The processing device 42 comprises a network protocol converter and an analogue-digital converter. A microphone-on-indicator 46 on the discussion unit 10 indicates to a delegate the microphone-on-state of his/her discussion unit 10, wherein the request-to-speak-indicator 48 on the discussion unit 10 indicates to the delegate the request-to-speak-state of his/her discussion unit 10.

In FIG. 3, a first embodiment of a design of a discussion unit 10 is depicted. The functionality of the discussion unit 10 may be similar or identical to the functionality of the discussion unit as described with reference to FIG. 2. Alternative or additional functionalities may be added.

The discussion unit 10 comprises a casing 410, which may comprise various materials, such as plastics, wood or metal. The casing 410 comprises an operating panel 412, which comprises a flat panel base 414. Further, the operating panel 412 comprises a number of operating elements, which are symbolically denoted by reference number 416. These operating elements 416 comprise a speaker button 418. The operating elements 416 may further comprise other operating elements, such as other buttons or dials, the functionality of which is known to the person skilled in the art and shall not be explained in further detail here.

The discussion unit 10 in this exemplary embodiment further comprises a microphone 58 and a loudspeaker 50. Alternatively or additionally, separate microphones 58 and/or separate loudspeakers 50 may be connected to the discussion unit 10, such as a separate stand-alone-microphone 58 and/or earphones instead of a loudspeaker 50. The discussion unit 10 further comprises an exchangeable portion 420, which, in this exemplary embodiment, has an essentially oval shape and is suited to act as a rim 422 covering the edge 424 of the operating panel 412 of the casing 410.

In order to render the exchangeable portion 420 detachable from the casing 410, several interconnections 426 are provided along the periphery of the rim 422 and the edge 424. In this embodiment, the interconnections 426 are of force-fit-type and comprise snap-hooks 428 along the periphery of the rim 422 of the casing 410. As counterparts for the snap-hooks 428, eyelet holes 430 are provided along the periphery of the rim 422, facing towards the casing 410. These eyelet holes 430 vertically protrude from the essentially planar rim 422.

For installing the rim 422 onto the casing 410, the rim 422 is positioned above the operating panel 412 and is moved in attachment direction 432. The snap-hooks 428 are positioned within essentially rectangular recesses along the edge 424 of the operating panel 412 and comprise a flexible tongue 436 and a catch 438 at the upper ends of the tongues 436. When pushing the rim 422 in attachment direction 432, rims 440 of the eyelet holes 430 slide into the recesses 434, and the catches 438 of the snap-hooks 428 engage with the eyelet holes 430. Thus, the rim 422 becomes firmly attached to the casing 410 of the discussion unit 10.

In order to remove the rim 422 from the casing 410, the tongues 436 of the snap-hooks 428 are pushed inwards by using an appropriate tool (e.g. a screwdriver or a more sophisticated, specifically adapted tool), whereby the catches 438 are pushed out of the eyelet holes 430, and the interconnections 426 disengage. Thus, the rim 422 may be removed from the casing 410.

As described above, the rim 422 may be ordered in several colors and/or materials, such as wood, metal etc., in order to match the ambiance of the conference system. The rim 422 is easy to install. In this embodiment, according to FIG. 3, the interconnections 426 are accessible from the outside of the casing 410. Nevertheless, without appropriate tools, a removal of the exchangeable portion 420 from the casing 410 is rather difficult, which is mostly due to the use of the force-fit interconnections 426. Nevertheless, by using a sufficient amount of effort, a participant of the conference may still be able to remove the rim 422.

Thus, in a preferred embodiment according to FIGS. 4A to 4D, the interconnections 426 may be designed in a way that these interconnections 426 are not accessible when the discussion unit 10 is in an assembled state. Therefore, in FIGS. 4A to 4D, a procedure is shown, which is necessary in order to remove the removable part 420 (which again is designed as a rim 422) from the casing 410 of the discussion unit 10.

It shall be noted that the basic functionality, especially the electrical functionality of the discussion unit 10 according to FIGS. 4A to 4D may be the same or similar to the functionality as described above. Thus, the only difference between the preferred embodiment according to FIGS. 4A to 4D to the embodiment according to FIG. 3 may be the fact that the interconnections 426 are not accessible from the outside when the casing 410 is assembled.

Figure 4A:
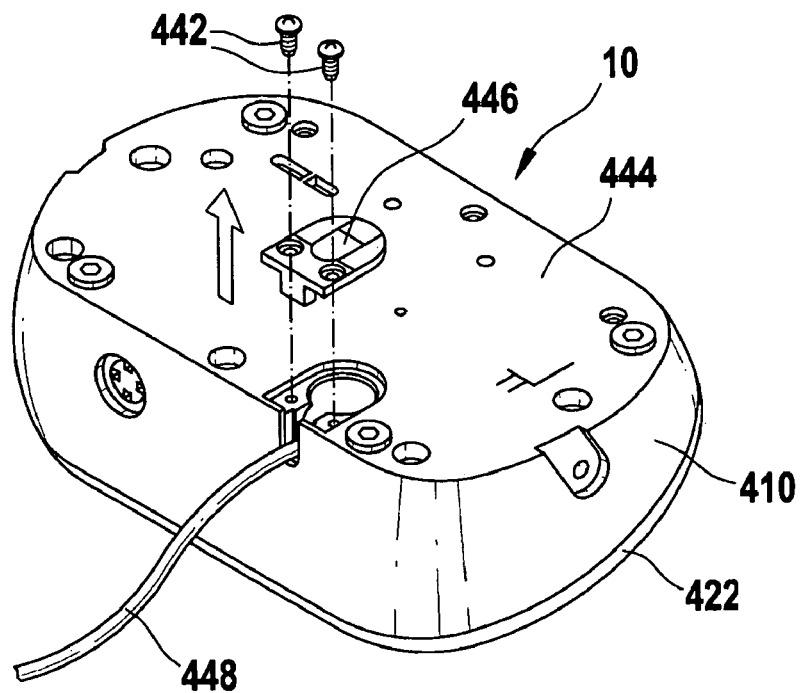

In a first step of the removal procedure of the rim 422, which is depicted in FIG. 4A, the discussion unit 10 is turned upside down, the bottom 444 of the discussion unit 10 facing upwards. Screws 442 are removed from the casing 410, in order to detach a strain-relief piece 446 for the electrical cable 448. The screws 442 may, e.g., be ordinary torx screws.

Figure 4B:
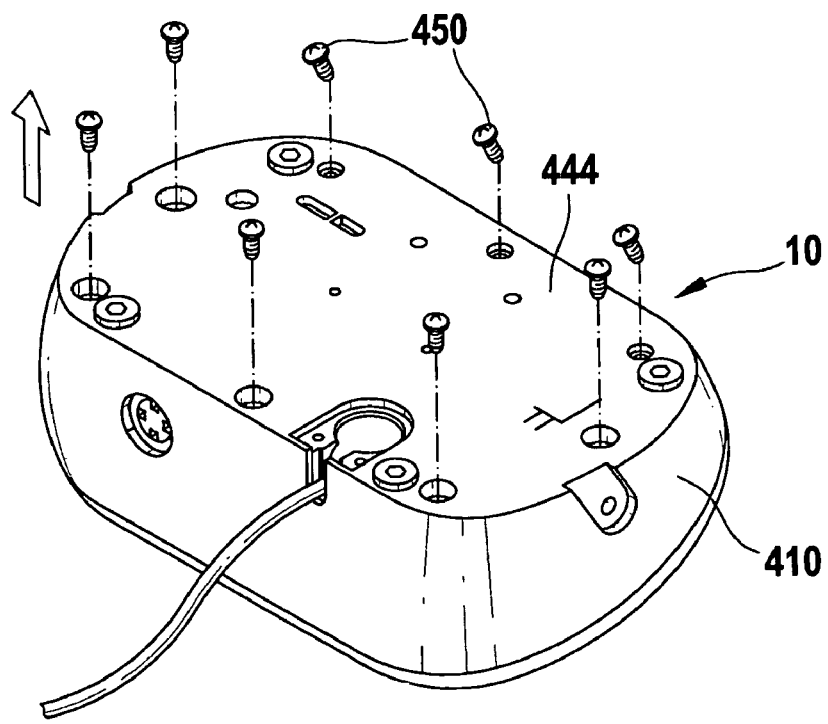
Figure 4C:
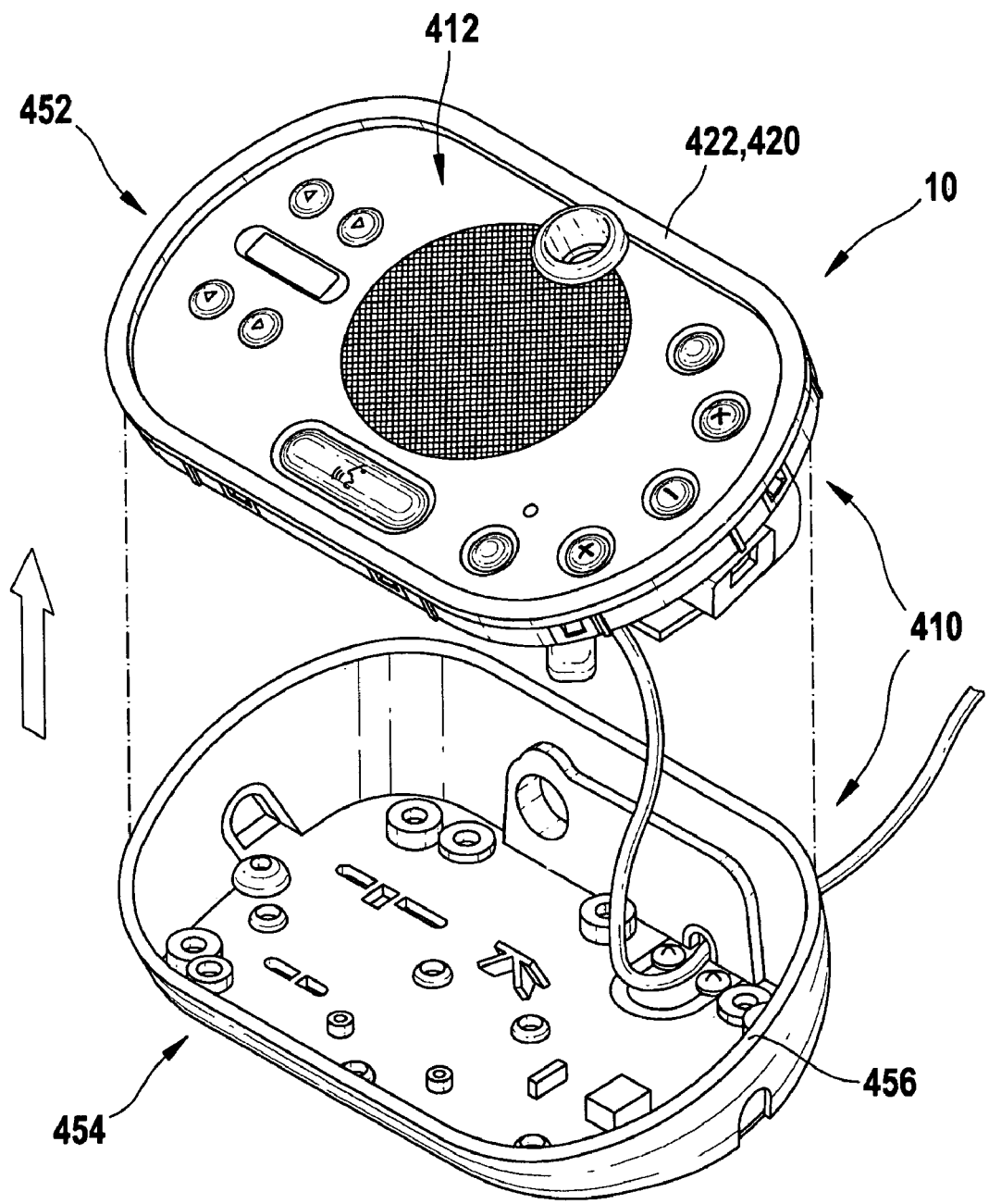

In a second step, which is depicted in FIG. 4B, a second set of screws 450, which may, e.g., be of the same type as the screws 442, are removed from the bottom 444 of the casing 410. This detachment of the screws 450 allows for a disassembling the casing 410 into a first section 452 and a second section 454. The first section 452 comprises the operating panel 410 and the rim 422 attached thereto. The second section 454 comprises the bottom 454 of the casing 410. The second section 454 of the casing 410 is designed in a way that it comprises an outer wall 456, which, in an assembled state of the casing 410 (as depicted in FIGS. 4A and 4B), covers interconnections 426 between the operating panel 412 (which is now part of the first section 452) and the rim 422.

These interconnections 426 are basically designed as depicted in FIG. 3 and comprise a number of snap-hooks 428, which themselves each comprise a tongue 436 and a catch 438, as depicted in FIG. 3. The interconnections 426 further comprise, as in FIG. 3, eyelet holes 430 with rims 440. Thus, after performing the procedure depicted in FIG. 4C and, thus, uncovering the interconnections 426, and by pushing the snap hooks 428 inwards (reference 458), the interconnections 426 may be disengaged, and the rim 422 may be removed (direction 460) from the first section 452 of the casing 410.

Thus, after removing the rim 422 according to the procedure depicted in FIGS. 4A to 4D, a new rim (e.g. a rim of a different color and/or material) may be attached to the first section 452 by reversing the procedure depicted in FIGS. 4A to 4D. Thus, the discussion unit 10 and the procedure shown in FIGS. 4A to 4D provides a stable system, allowing for a service technician to remove and exchange the rim 422, whereas a participant of the conference or discussion is not in the position to easily exchange the rim 422.

The invention claimed is:

1. A discussion unit (10) for use in a conference system, wherein the discussion unit (10) is adapted to be connected to at least one second discussion unit (10), and wherein the discussion unit (10) comprises an essentially closed casing (410) having a base (414) and an additional narrow circumferentially closed edge (424) completely surrounding the closed casing (410) and at least one exchangeable portion (420) consisting of a hollow only circumferentially closed rim (422) that is removably mounted to the closed casing (410) so as to cover only the narrow circumferentially closed edge (424) of the closed casing (410).

2. The discussion unit (10) according to claim 1, wherein the exchangeable portion (420) covers an outer ring-like portion of a surface of an outside part (412) of the closed casing (410).

3. The discussion unit (10) according to claim 1, wherein the closed casing (410) comprises at least one operating panel (412), the operating panel (412) having at least one panel base (414) and at least one operating element (416), wherein panel base (414) is at least partially surrounded by the rim (422) on its circumferential edge (424).

4. The discussion unit (10) according to claim 1, wherein the at least one exchangeable portion (420) is mounted to the closed casing (410) by at least one interconnection (426), the at least one interconnection (426) comprising at least one of the following: a form-fit interconnection; a force-fit interconnection (426), preferably a snap-on mounting and/or a snap-hook (428) and/or a catch (438).

5. The discussion unit (10) according to claim 4, wherein the closed casing (410) comprises at least one first section (452) and at least one second section (454), the at least one first section (452) and the at least one second section (454) being adapted to be attached to each other, wherein the at least one interconnection (426) is inaccessible from the outside of the casing (410) when the at least one first section (452) and the at least one second section (454) are attached to each other.

6. The discussion unit (10) according claim 1, wherein the at least one first section (452) and the at least one second section (454) are adapted to be attached to each other by means of screwing.

7. An exchangeable portion (420) adapted to be used as the at least one exchangeable portion (420) in a discussion unit (10) according to claim 1.

8. A set of exchangeable portions (420), the set comprising at least two exchangeable portions (420) according to claim 7, wherein at least two of the exchangeable portions (420) differ with regard to color and/or material.

9. A conference system comprising at least two discussion units (10) according to claim 1 referring to a discussion unit (10).

10. A discussion unit (10) for use in a conference system and adapted for connection to at least one second discussion unit (10), the discussion unit (10) comprising an essentially closed casing (410) having a base (414), a first section (452), a second section (454), a narrow circumferentially closed edge (424) completely surrounding the closed casing (410) and an exchangeable portion (420) consisting of a hollow only circumferentially closed rim (422) that is removably mounted to the closed casing (410) so as to cover only the narrow circumferentially closed edge (424) of the closed casing (410) using an interconnection (426), wherein the first section (452) and the second section (454) are adapted to be attached to each other in an arrangement that renders the interconnection (426) inaccessible from outside of the casing (410).

* * * * *